United States Patent [19]
Cappelletti et al.

[11] Patent Number: 5,637,520
[45] Date of Patent: Jun. 10, 1997

[54] PROCESS FOR FABRICATING INTEGRATED DEVICES INCLUDING FLASH-EEPROM MEMORIES AND TRANSISTORS

[75] Inventors: Paolo G. Cappelletti, Seveso; Daniele Cantarelli, Villasanta, both of Italy

[73] Assignee: SGS-Thomson Microelectronics S.r.l., Agrate Brianza, Italy

[21] Appl. No.: 195,369

[22] Filed: Feb. 10, 1994

[30] Foreign Application Priority Data

Feb. 11, 1993 [EP] European Pat. Off. ............. 93830050

[51] Int. Cl.⁶ ................................................. H01L 21/8247
[52] U.S. Cl. ................................................ 438/258; 438/981
[58] Field of Search ........................... 437/43, 49, 48, 437/52, 235, 238; 257/316; 148/DIG. 163

[56] References Cited

U.S. PATENT DOCUMENTS

| | | | |
|---|---|---|---|
| 4,766,088 | 8/1988 | Kono et al. | 437/52 |
| 5,086,008 | 2/1992 | Riva | 437/41 |
| 5,132,239 | 7/1992 | Ghezzi et al. | 437/43 |
| 5,215,934 | 6/1993 | Tzeng | 437/43 |
| 5,254,489 | 10/1993 | Nakata | 437/40 |
| 5,316,981 | 5/1994 | Gardner et al. | 437/235 |
| 5,384,279 | 1/1995 | Stolmeijer et al. | 437/57 |
| 5,449,629 | 9/1995 | Kajita | 437/43 |
| 5,498,577 | 3/1996 | Fulford, Jr. et al. | 437/228 |

FOREIGN PATENT DOCUMENTS

| | | |
|---|---|---|
| 106617 | 4/1984 | European Pat. Off. . |
| 244367 | 11/1987 | European Pat. Off. . |
| 305741 | 3/1989 | European Pat. Off. . |
| 107543 | 2/1981 | Germany . |
| 167602 | 5/1986 | United Kingdom . |

*Primary Examiner*—John Niebling
*Assistant Examiner*—Richard A. Booth
*Attorney, Agent, or Firm*—Wolf, Greenfield & Sacks, P.C.; James H. Morris

[57] ABSTRACT

A process for simultaneously fabricating a flash-EEPROM memory and circuit transistors using a DPCC process. A first polysilicon layer is not removed from the circuit area, and the gate regions of a circuit transistors are formed by shorting first and second polysilicon layers. A thin tunnel oxide layer of the memory cells is formed using the same mask provided for implanting boron into the cell area of the substrate. Following implantation and without removing the mask, the gate oxide formed previously over the whole surface of the wafer is removed from the cell area; the boron implant mask is removed; and tunnel oxidation is performed to increase the thickness of the tunnel oxide by a desired amount, and to slightly increase the thickness of the oxide in the transistor area.

13 Claims, 3 Drawing Sheets

PROCESS FOR FABRICATING INTEGRATED DEVICES INCLUDING FLASH-EEPROM MEMORIES AND TRANSISTORS

BACKGROUND OF THE INVENTION

1. Field of the Invention

The present invention relates to a process for fabricating integrated devices including flash-EEPROM memories and transistors.

2. Discussion of the Related Art

Flash-EEPROM memories are Electrically Erasable Programmable Read Only Memories (EEPROMs) which combine the high density and low cost of EPROMs, with the advantage of electrical erasability. These memories have recently become the most attractive of the nonvolatile memories for their potential application in solid state disks for portable computers.

Although different flash memory concepts have been developed, most flash manufacturers utilize a double-poly single-transistor cell which is very similar to a standard EPROM cell.

FIGS. 1 and 2 are cross-sectional views of EPROM and flash-EEPROM cells, respectively. As shown in FIG. 1, an EPROM cell, indicated as a whole by 1, is formed in a P-type substrate 2, having N+ type source and drain regions 3 and 4, respectively, separated by a channel region 5 formed by the substrate itself. Over substrate 2, at channel 5, two gate regions are provided: a floating gate region 6 completely embedded in an oxide layer 8, and a control gate region 7. Gate region 6 is made of polycrystalline silicon; gate region 7 may be polysilicon or polycide (polysilicon and silicide). The floating gate region is separated from the substrate by an oxide layer (gate oxide) 8a of a given thickness (typically 200 Angstroms).

As shown in FIG. 2, a flash-EEPROM cell, indicated as a whole by 15, is very similar to the EPROM cell shown in FIG. 1, and is formed in a P-type substrate 16, having source and drain regions 17 and 18, respectively, separated by a channel 19. A floating gate region 20, and a control gate region 21, both surrounded by an oxide layer 22, are provided. As compared with EPROM cell 1, however, the oxide layer 22a, which separates floating gate region 20 from substrate 16, is known as the tunnel oxide and is much thinner than oxide layer 8a, typically 100–130 A. In the specific embodiment shown, source region 17 has a graded junction with the substrate, and is formed in two parts: a heavily doped (N+) part 17a facing the larger surface 23 of the substrate, and a deeper, lightly doped (N-) part 17b surrounding part 17a on the sides not facing surface 23.

The purpose of a graded junction is to enable the cell to better withstand the electrical stress to which it is subjected during erasing and programming, and may or may not be provided, depending on the operating conditions of the memory array. The thin tunnel oxide layer, on the other hand, is essential for enabling electronic erasing (and programming) of the cell by Fowler-Nordheim tunneling between the substrate and floating gate.

Due to its limited thickness, flash-EEPROM fabrication involves specific steps for forming the tunnel oxide layer, thus ruling out direct application of standard EPROM processes.

The present applicant has developed and patented an EPROM process whereby the second polysilicon layer is deposited directly on the first in the circuit transistor area for forming the gate regions of the transistors. This process, unlike other known processes, does not require removal of the first polysilicon layer in the circuit area. This process, which is discussed in U.S. Pat. No. 4,719,184 issued Jan. 12, 1988, is known as DPCC (Shorted Double Poly) and provides advantages of reliability and in the number of masks required.

SUMMARY OF THE INVENTION

It is an object of the present invention to provide a process to fabricate integrated devices, designed to exploit the basic principle and to achieve the technical advantages of the known DPCC process.

According to the present invention, a process for fabricating integrated devices including flash-EEPROM memories and transistors is provided. A substrate has transistor areas and memory cell areas. A first oxide is grown on the transistor areas and the cell areas. The oxide is removed from the cell areas and a second oxide area is grown on the cell areas and the transistor areas. Preferably, the thickness of the oxide in the cell areas is about 100–130 Angstroms, while the oxide in the transistor areas has the thickness of the oxide in the cell areas plus the thickness of the first oxide.

Preferably, a doping mask is provided before the cell areas are doped with conductivity-modifying ions. Without removing the mask, the oxide is removed from the cell areas. The mask is then removed before the second oxide is grown. Preferably, after the second oxide layer is grown, a dielectric material layer is deposited and then removed from the transistor areas. A second polycrystalline silicon layer is deposited. The second polycrystalline silicon layer and the dielectric material layer are masked and selectively removed at sides of the cell areas, and the second and first polycrystalline silicon layers and the gate oxide layer are masked and removed from the sides of the transistor areas to expose source and drain areas for the circuit transistors. Using the same mask, the first polycrystalline silicon layer and the tunnel oxide layer are selectively removed from the sides of the cell areas to expose source and drain areas of the memory cells.

BRIEF DESCRIPTION OF THE DRAWINGS

An embodiment of the present invention will be described by way of example with reference to the accompanying drawings, in which.

DETAILED DESCRIPTION

With reference to FIGS. 3–9, a description will first be given of the known DPCC process for fabricating EPROM cells and circuit transistors according to U.S. Pat. No. 4,719,184. In particular, the following description relates to various steps in a CMOS DPCC process for fabricating an EPROM memory cell and CMOS transistors.

Figure 1:
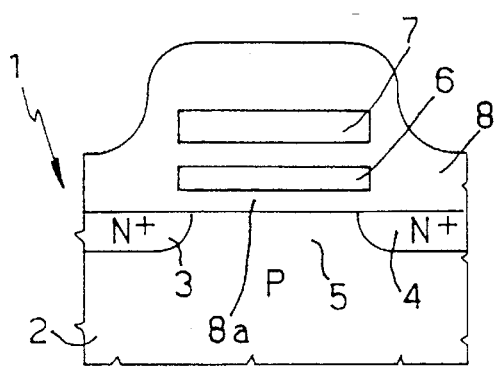
FIG. 1 is a cross sectional view of a known EPROM cell.
Figure 2:
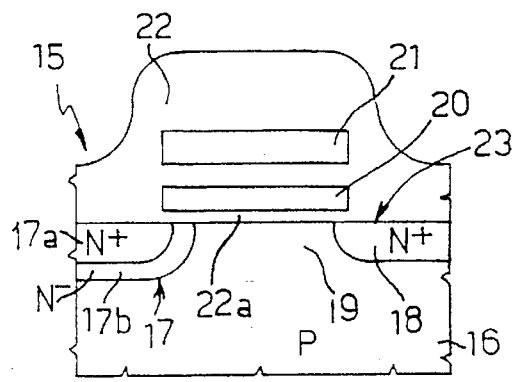
FIG. 2 is a cross sectional view, as in FIG. 1, of a known flash-EEPROM cell.
Figure 3:
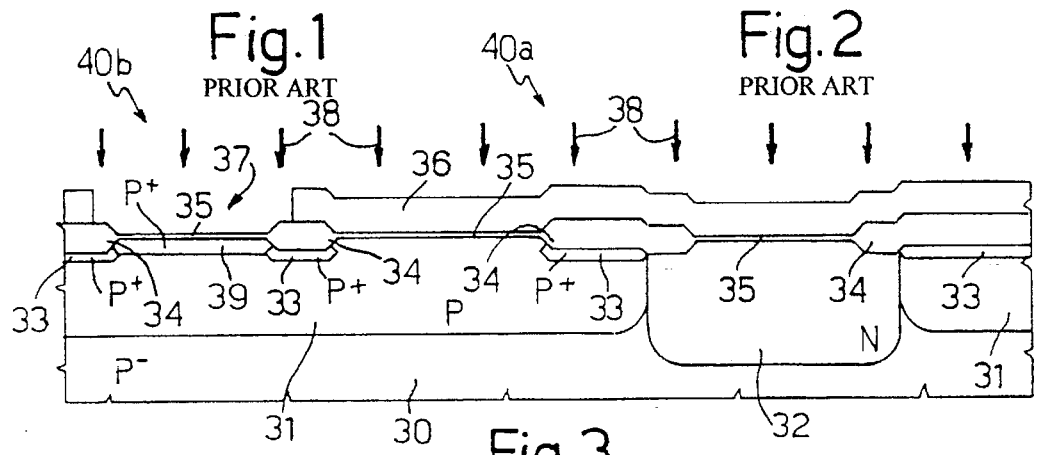
FIGS. 3–9 are cross-sectional views of a silicon wafer in various steps in the known DPCC process for fabricating an integrated device including an EPROM memory and transistors.

FIG. 3 shows an intermediate structure obtained by forming, in a P⁻-type substrate 30, P-type wells 31, N-type wells 32 and P+-type enriched insulating regions 33 for the formation of channel stoppers, overlaid with thick field oxide regions 34. A gate oxide layer 35 is provided over substrate 30 to cover the active regions where the circuit transistors and memory array cell are to be formed and which elsewhere merges with field oxide layer 34. All the above layers and regions are obtained through standard process steps.

An EPROM cell implant mask (EPM mask) is then formed for implanting boron ions in the channel area of the memory cell, as required to prevent punch-through of the substrate in the presence of strong electric fields, and to enhance programming efficiency.

This step is shown in FIG. 3, which shows the resist mask 36 covering the entire circuit portion (to the right in FIG. 3 onwards, and indicated as a whole by 40a) and having a window 37 over cell array area 40b in which the cell is to be formed. Arrows 38 in FIG. 3 indicate boron implantation for forming a P+ type layer 39 in the active region of the cell.

Figure 4:
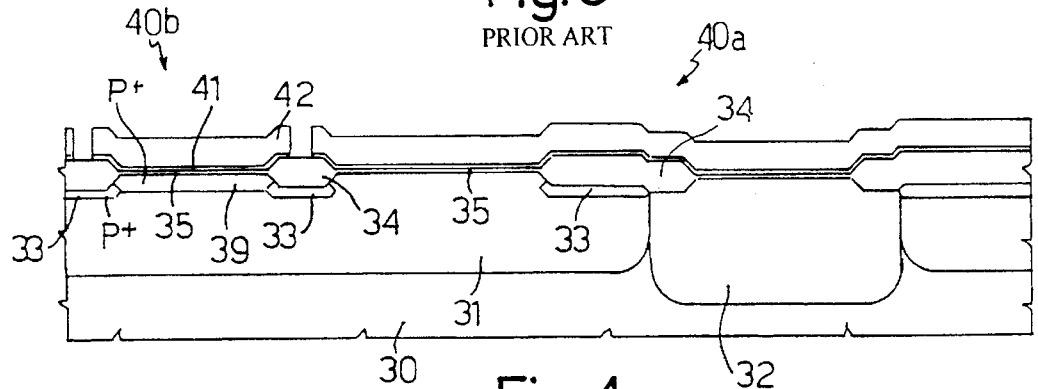

Resist mask 36 is removed; a first polycrystalline silicon layer is deposited (poly1, indicated by 41), and poly1 41 is doped with $POCl_3$ and subsequently shaped using a resist mask 42. Mask 42 covers the entire circuit portion and enables the exposed poly1 portions on either sides of memory area 40b to be etched and removed, as shown in FIG. 4.

Figure 5:
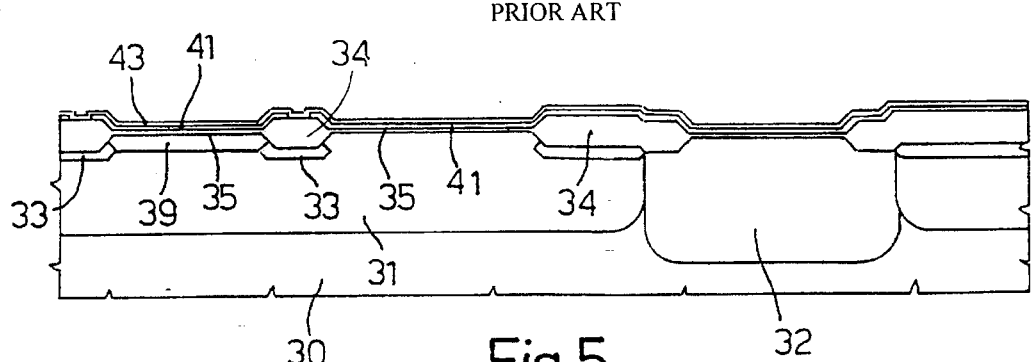

A dielectric layer 43 (so-called interpoly dielectric) is then grown consisting, in this case, of a triple ONO (thermal oxide/CVD nitride/thermal oxide) layer, but which alternatively consist of a single oxide layer, as shown in FIG. 5 (showing the intermediate structure after growing dielectric layer 43).

Figure 6:
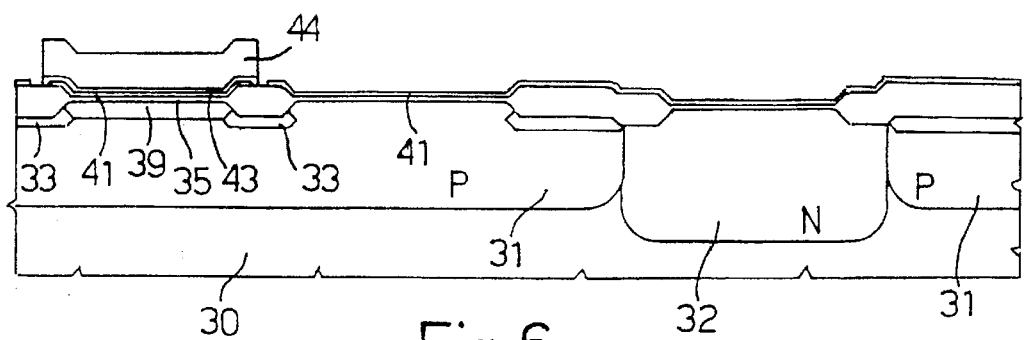
Figure 7:
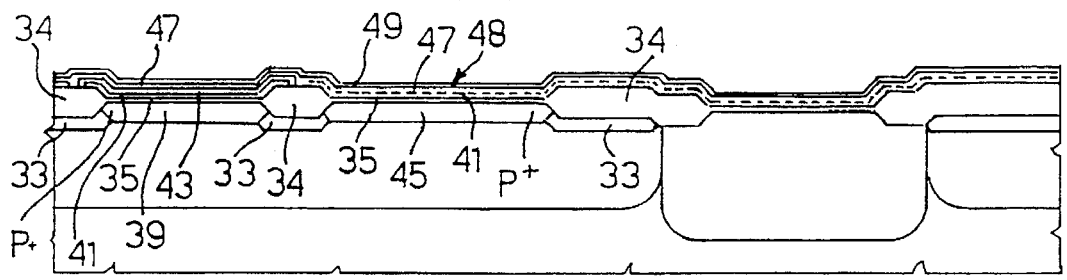

Referring in particular to FIGS. 6 and 7, an array mask 44 is deposited to cover cell array area 40b and to leave circuit area 40a exposed. The exposed portions of dielectric layer 43 are removed, resulting in an intermediate structure shown in FIG. 6. Mask 44 is removed and a further LVS mask (not shown) is deposited. Boron ions are implanted to adjust the threshold of the N channel circuit transistors and thus form a P+ enriched region 45 (FIG. 7). At the same time, this implanting step also reduces surface doping concentration in the active regions of the P channel transistors in N well 32, and thus adjusts the threshold to a desired value.

After the LVS mask (not shown) is removed, a second polycrystalline silicon layer 47 (poly2) is deposited. As shown in FIG. 7, in circuit area 40a, poly2 47 is deposited directly onto poly1 41 and merges with it to form a single polysilicon layer 48 (divided by the dotted line into two layers in the drawings for the sake of clarity). In the memory array area, however, poly2 47 is separated from poly1 41 by dielectric layer 43. Poly2 47 is then doped with $POlC_3$, and a layer of CVD silicide 49, e.g. tungsten silicide $WSi_2$, is deposited to give the intermediate structure shown in FIG. 7.

Figure 8:
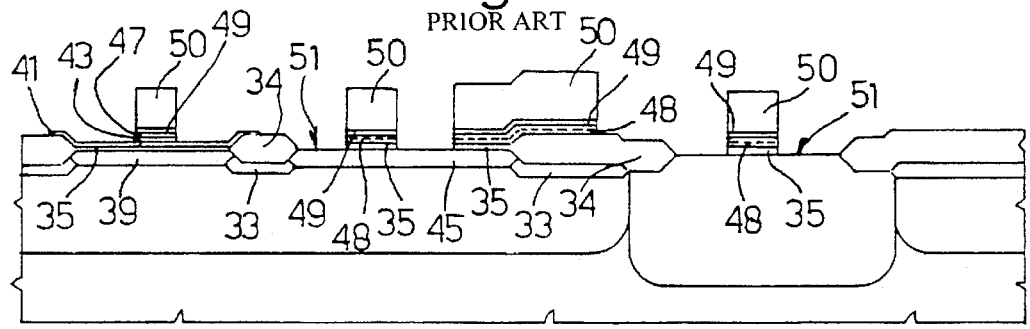

Referring in particular to FIG. 8, poly2 mask 50 is formed to shape the gate regions of the circuit transistors and the control gate regions of the array cells. The exposed portions of the polysilicon layer, i.e., layer 41 for the memory cells and layer 48 for the transistors are removed by etching down to polysilicon layer 41 of the memory cells, and the larger surface 51 of the substrate in circuit transistor area 40a, thus providing the intermediate structure shown in FIG. 8.

Figure 9:
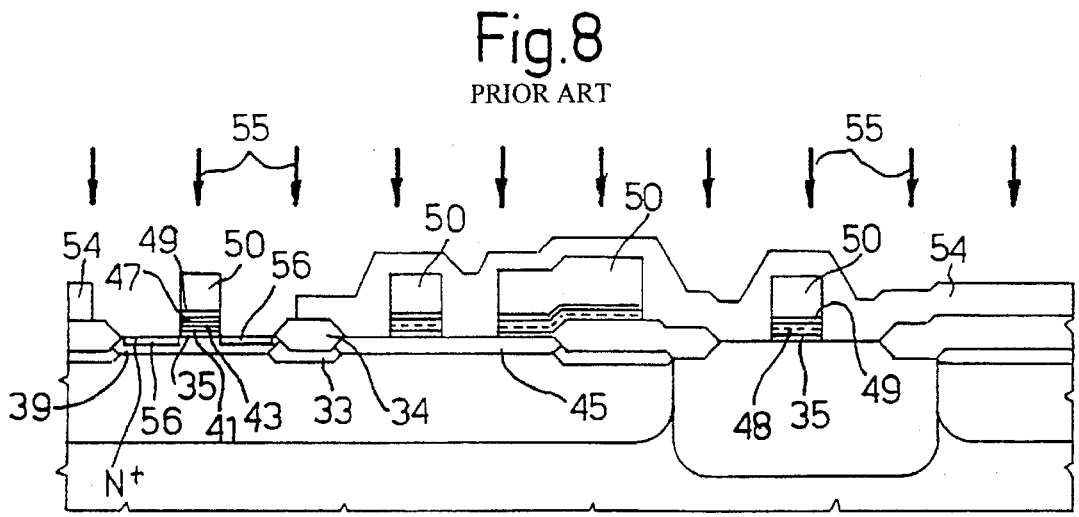

Referring in particular to FIG. 9, on top of poly2 mask 50, a further transistor protection mask 54 is deposited to only cover all of circuit area 40a. Portions of poly1 left exposed by mask 50 or mask 54 are etched to self-align the floating gate regions with the control gate regions. Before removing masks 50, 54, arsenic is implanted, as shown by arrows 55 to form, in the active area of the memory array cells and self-aligned with the floating gate and control gate regions, N type drain and source regions 56, as shown in the intermediate structure of FIG. 9.

The rest of the process then follows the standard CMOS process, for forming the source and drain regions of the circuit transistors, the component protection layers, and the connections.

One embodiment of the process according to the present invention relative to the formation of a flash-EEPROM cell and a pair of CMOS complementary transistors will now be described with reference to FIGS. 10–13.

Figure 10:
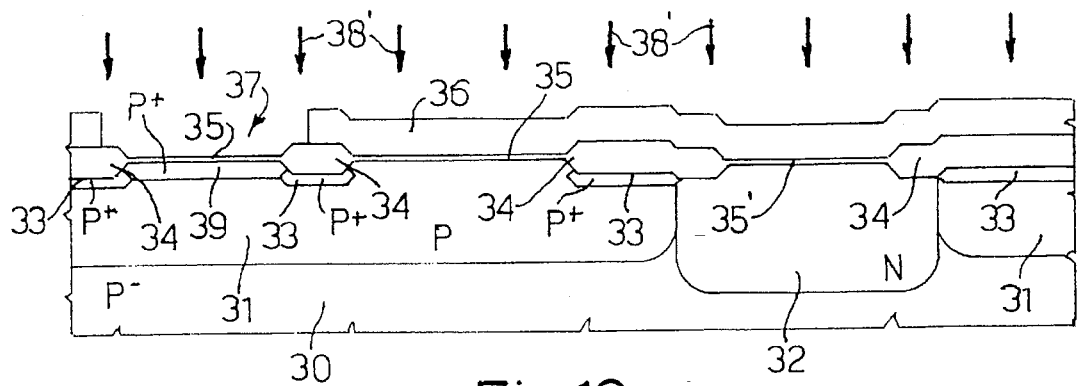
FIGS. 10–13 are cross-sectional views of a silicon wafer relative to various steps in the fabrication of an integrated device including a flash-EEPROM memory and transistors according to the present invention.

The process according to the present invention comprises the same initial steps described above for forming the intermediate structure of FIG. 3, which is again reproduced in FIG. 10 for the sake of clarity. Layers and regions in the present process which are identical to those of the known process described above are indicated using the same numbering system as in FIGS. 3–9.

According to FIG. 10, a P-type substrate 30 has P-type wells 31; N-type wells 32; field insulating regions 34; channel stoppers 33; and a thin oxide layer 35'. As explained in more detail below to obtain the required finish thickness of layer 35', a number of parameters are adjusted as compared with the known process described with reference to FIGS. 3–9. As shown in FIG. 10, cell implant (EPM) mask 36 is already present, and, as in FIG. 3, a cell implant (arrows 38') is performed to obtain P-type regions 60. In view of the different characteristics of the EPROM cells formed in the process of FIGS. 3–9 and the flash-EEPROM cells formed in accordance with the present invention, the conditions of implant 38' differ from those of the EPROM process as described above.

Figure 11:
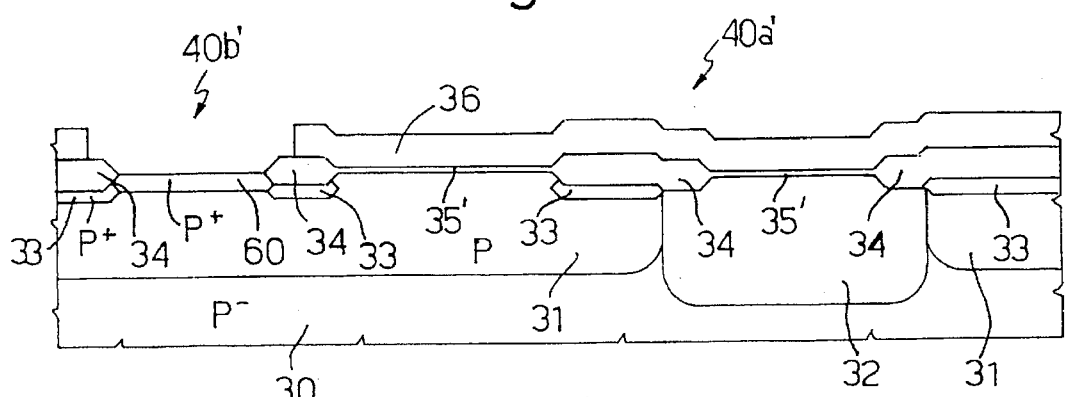
Figure 12:
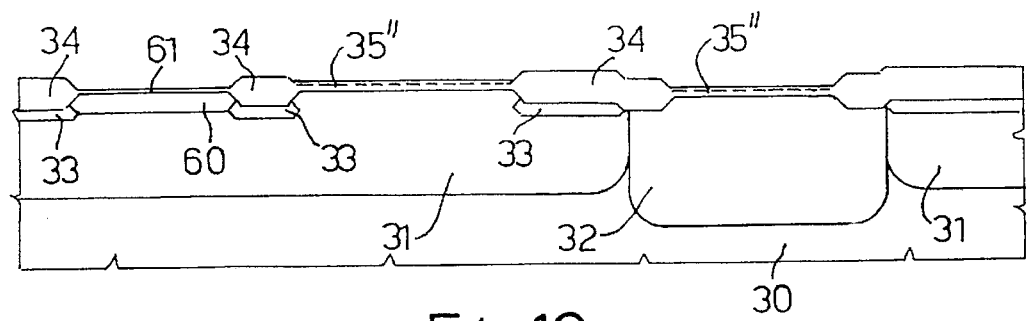

Using the same cell implant (EPM) mask 36, gate oxide layer 35' is etched and removed from cell area 40b', resulting in the intermediate structure shown in FIG. 11. At this time, EPM mask 36 is removed and the wafer is cleaned. The wafer is oxidized to grow a thin oxide layer 61 directly on the surface of the substrate in cell area 40b', the oxidation parameters being selected to achieve the required characteristics, and particularly the thickness, of the thin tunnel oxide layer. Oxidation slightly increases the thickness of the gate oxide of the circuit transistors, as shown (exaggerated for clarity) by the dotted line in FIG. 12 showing the original thickness of layer 35'. The gate oxide layer on the circuit portion is indicated as 35" to take into account the increased thickness, though it is substantially equivalent to layer 35 in the known process.

As stated above, the initial thickness of gate oxide layer 35' must be calculated to allow for the increase in tunnel oxidation and the slight reduction when the wafer is cleaned prior to forming the thin tunnel oxide.

Figure 13:
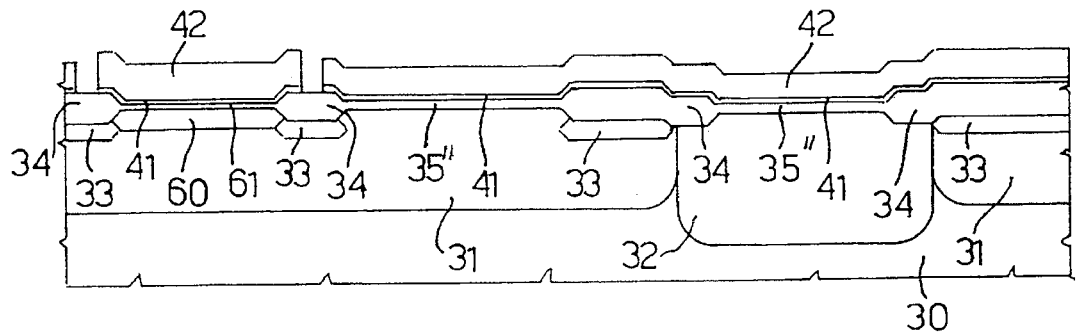

At this point, the known process is followed for depositing a first polycrystalline silicon layer 41; doping it with $POlC_3$; forming poly1 mask 42; and shaping layer 41, as shown in FIG. 13, and as shown in FIG. 4, except for thin oxide layer 61 and the different characteristics of region 60. This is followed by the steps as described in connection with FIGS. 5–9 including depositing a dielectric layer; removing it from the circuit portion; depositing a second polysilicon layer; depositing a silicide layer; shaping the gate regions in the circuit transistor area and the control gate regions in the array; self-aligned shaping of the floating gate regions in the array; source and gate implants of the array cells and circuit transistors; and formation of the protection and connecting layers.

The process according to the present invention thus provides a method for producing a flash-EEPROM memory array and associated transistors using the DPCC process, and thus exploits the intrinsic advantages, and in particular the experience and know-how of the process for obtaining memories of known, reliable electric characteristics. Moreover, the possibility of producing flash-EEPROM memories using the DPCC process allows for the production of two families of products (EPROM and flash-EEPROM memories) on the same fabrication line with no significant differences, and by using the same machinery.

According to the present invention, flash-EEPROM memory cells are produced with no need for specific masking, and therefore at substantially the same cost as EPROM memories.

To those skilled in the art it will be clear that changes may be made to the process as described and illustrated herein without, however, departing from the scope of the present invention. In particular, the process described is applicable to devices including CMOS and NMOS transistors, regardless of the type of dielectric employed (ONO or single oxide layer), and regardless of the material of the control gate region (polysilicon or polycide, i.e. polysilicon and silicide).

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. A method for fabricating flash-EEPROM nonvolatile memory cells and circuit transistors from a substrate having a surface, the substrate having cell areas in which the memory cells are formed, and transistor areas in which the circuit transistors are formed; the method comprising the steps of:

growing field oxide regions in portions of the surface of the substrate;

forming a gate oxide layer in the transistor areas, the gate oxide layer comprising a first oxide layer and a tunnel oxide layer superimposed on the first oxide layer;

forming the tunnel oxide layer on the surface of the substrate in the cell areas, the tunnel oxide layer being thinner than the gate oxide layer;

depositing a first polycrystalline silicon layer;

selectively removing portions of the first polycrystalline silicon layer from sides of the cell areas and of the transistor areas;

depositing a dielectric material layer;

removing the dielectric material layer from the transistor areas thereby exposing the first polycrystalline silicon layer in the transistor areas;

only after the dielectric material layer is removed from the transistor areas, depositing a second polycrystalline silicon layer, the second polycrystalline silicon layer in direct electrical contact with the first polycrystalline silicon layer in the transistor areas;

masking and selectively removing the second polycrystalline silicon layer and the dielectric material layer at the sides of the cell areas and the second and first polycrystalline silicon layers and the gate oxide layer from the sides of the transistor areas to expose source and drain areas for the circuit transistors; and using the same mask, selectively removing the first polycrystalline silicon layer and the tunnel oxide layer from the sides of the cell areas to expose source and drain areas of the memory cells so that flash-EEPROM memory cells are formed in the cell areas;

wherein the step of forming a gate oxide layer in the transistor areas comprises the steps of:

growing a gate oxide layer over the surface of the substrate in the cell areas and in the transistor areas;

forming a doping mask on the surface of the substrate to cover the transistor areas and not the cell areas;

doping the cell areas with conductivity-modifying ions using the doping mask and through the gate oxide layer; and removing the gate oxide layer from the cell areas using the doping mask.

2. A method, for fabricating flash-EEPROM nonvolatile memory cells and circuit transistors from a substrate having a surface, the substrate having cell areas in which the memory cells are formed, and transistor areas in which the circuit transistors are formed; the method comprising the steps of:

growing field oxide regions in portions of the surface of the substrate;

forming a gate oxide layer in the transistor areas;

forming a tunnel oxide layer on the surface of the substrate in the cell areas;

depositing a first polycrystalline silicon layer;

selectively removing portions of the first polycrystalline silicon layer from sides of the cell areas and of the transistor areas;

depositing a dielectric material layer;

removing the dielectric material layer from the transistor areas thereby exposing the first polycrystalline silicon layer in the transistor areas;

depositing a second polycrystalline silicon layer, the second polycrystalline silicon layer in direct electrical contact with the first polycrystalline silicon layer in the transistor areas;

masking and selectively removing the second polycrystalline silicon layer and the dielectric material layer at the sides of the cell areas and the second and first polycrystalline silicon layers and the gate oxide layer from the sides of the transistor areas to expose source and drain areas for the circuit transistors; and using the same mask, selectively removing the first polycrystalline silicon layer and the tunnel oxide layer from the sides of the cell areas to expose source and drain areas of the memory cells wherein the step of forming a tunnel oxide layer is performed after the step of forming a gate oxide layer, wherein the step of forming a gate oxide layer in the transistor areas comprises the steps of:

growing a gate oxide layer over the surface of the substrate in the cell areas and in the transistor areas;

forming a doping mask over the surface of the substrate to cover the transistor areas and not the cell areas;

doping the cell areas with conductivity-modifying ions using the doping mask and through the gate oxide layer; and removing the gate oxide layer from the cell areas using the doping mask.

3. The method of claim 2, further comprising the step of removing the doping mask after the step of selectively removing portions of the gate oxide layer from the cell areas;

wherein the step of forming a tunnel oxide layer is performed over the whole surface of the substrate to increase the thickness of the gate oxide layer in the transistor areas.

4. A method for fabricating flash-EEPROM nonvolatile memory cells and circuit transistors from a substrate having a surface, cell areas in which the memory cells are formed, and transistor areas in which the circuit transistors are formed; the method comprising the steps of:

forming a first oxide layer in the transistor areas and in the cell areas;

providing a doping mask over the transistor areas and not over the cell areas;

doping the cell areas with conductivity-modifying ions using the doping mask and through the first oxide layer;

removing the first oxide layer from the cell areas using the doping mask;

removing the doping mask, after removing the first oxide layer from the cell areas; and forming a second oxide layer over the cell areas and the transistor areas so that the second oxide layer has a thickness that is less in thickness than the thickness of the first and second oxide layers together in the transistor areas.

5. The method of claim 4, wherein the step of providing a second oxide layer includes providing a second oxide layer so that the thickness is about 100–130 Angstroms.

6. A method for fabricating flash-EEPROM nonvolatile memory cells and circuit transistors from a substrate having a surface, cell areas in which the memory cells are formed, and transistor areas in which the circuit transistors are formed; the method comprising the steps of:

forming a first oxide layer in the transistor areas and the cell areas;

providing a doping mask over the transistor areas and not over the cell areas;

doping the cell areas with conductivity-modifying ions using the doping mask and through the first oxide layer;

removing the first oxide layer from the cell areas using the doping mask; and providing a second oxide layer over the cell areas and the transistor areas, so that the thickness of the second oxide layer at the cell areas is less than the thickness of the first and second oxide layers together at the transistor areas.

7. A method for fabricating flash-EEPROM nonvolatile memory cells and circuit transistors from a substrate having a surface, cell areas in which the memory cells are formed, and transistor areas in which the circuit transistors are formed; the method comprising the steps of:

forming a first oxide layer in the transistor areas and the cell areas;

providing a doping mask over the transistor areas and not over the cell areas;

doping the cell areas with conductivity-modifying ions using the doping mask and through the first oxide layer;

removing the first oxide layer from the cell areas using the doping mask;

removing the doping mask after the step of removing the first oxide layer from the cell areas; and providing a second oxide layer over the cell areas, after the step of removing the doping mask.

8. The method of claim 4, further comprising the steps of:

depositing a first polycrystalline silicon layer;

depositing a dielectric material layer;

removing the dielectric layer form the transistor areas;

depositing a second polycrystalline silicon layer;

masking and selectively removing the second polycrystalline silicon layer and the dielectric material layer at the sides of the cell areas and the second and first polycrystalline silicon layers and the first oxide layer from sides of the transistor areas to expose source and drain areas for the circuit transistors; and using the same mask, selectively removing the first polycrystalline silicon layer and the second oxide layer from sides of the cell areas to expose source and drain areas for the memory cells.

9. The method of claim 6, wherein the step of providing a second oxide layer includes providing a second oxide layer so that the thickness is about 100–130 Angstroms.

10. The method of claim 5, wherein the step of forming a first oxide layer includes forming a layer having a thickness of about 200 Angstroms.

11. The method of claim 6, further comprising the steps of:

depositing a first polycrystalline silicon layer;

depositing a dielectric material layer;

removing the dielectric layer form the transistor areas;

depositing a second polycrystalline silicon layer;

masking and selectively removing the second polycrystalline silicon layer and the dielectric material layer at the sides of the cell areas and the second and first polycrystalline silicon layers and the first oxide layer from sides of the transistor areas to expose source and drain areas for the circuit transistors; and using the same mask, selectively removing the first polycrystalline silicon layer and the second oxide layer from sides of the cell areas to expose source and drain areas for the memory cells.

12. The method of claim 7, further comprising the steps of:

depositing a first polycrystalline silicon layer;

depositing a dielectric material layer;

removing the dielectric layer form the transistor areas;

depositing a second polycrystalline silicon layer;

masking and selectively removing the second polycrystalline silicon layer and the dielectric material layer at the sides of the cell areas and the second and first polycrystalline silicon layers and the first oxide layer from sides of the transistor areas to expose source and drain areas for the circuit transistors; and using the same mask., selectively removing the first polycrystalline silicon layer and the second oxide layer from sides of the cell areas to expose source and drain areas for the memory cells.

13. A method for fabricating flash-EEPROM nonvolatile memory cells and circuit transistors in a substrate having a surface, the substrate having cell areas in which the memory cells are formed and transistor areas in which the circuit transistors are formed, the method comprising the steps of:

growing field oxide regions in portions of the surface of the substrate;

forming a first oxide layer at the surface above the transistor areas and the cell areas;

providing a doping mask over the transistor areas and not over the cell areas;

doping the cell areas with conductivity-modifying ions using the doping mask and through the first oxide layer;

removing the first oxide layer from above the cell areas using the doping mask;

removing the doping mask from above the transistor area, after removing the first oxide layer from above the cell areas;

providing a second oxide layer over the cell areas and the transistor areas so that an oxide layer above the cell areas has a thickness that is less in thickness than a thickness of an oxide layer above the transistor areas which includes the first and second oxide layers together;

depositing a first polycrystalline silicon layer;

selectively removing portions of the first polycrystalline silicon layer from sides of the cell areas and of the transistor areas;

depositing a dielectric material layer;

removing the dielectric material layer from the transistor areas thereby exposing the first polycrystalline silicon layer in the transistor areas;

only after the dielectric material layer is removed from the transistor areas, depositing a second polycrystalline silicon layer, the second polycrystalline silicon layer in direct electrical contact with the first polycrystalline silicon layer in the transistor areas;

masking and selectively removing the second polycrystalline silicon layer and the dielectric material layer at the sides of the cell areas and the second and first polycrystalline silicon layers and the gate oxide layer from the sides of the transistor areas to expose source and drain areas for the circuit transistors; and using the same mask, selectively removing the first polycrystalline silicon layer and the tunnel oxide layer from the sides of the cell areas to expose source and drain areas of the memory cells so that flash-EEPROM memory cells are formed in the cell areas.

* * * * *